United States Patent
Djurdjevic et al.

(10) Patent No.: US 11,233,528 B1
(45) Date of Patent: Jan. 25, 2022

(54) METHOD AND APPARATUS FOR LDPC DECODING USING INDEXED MESSAGES

(71) Applicant: Seagate Technology LLC, Fremont, CA (US)

(72) Inventors: Ivana Djurdjevic, San Jose, CA (US); Ara Patapoutian, Shrewsbury, MA (US); Deepak Sridhara, Longmont, CO (US); Bengt Anders Ulriksson, Shrewsbury, MA (US); Jeffrey John Pream, Longmont, CO (US)

(73) Assignee: Seagate Technology LLC, Fremont, CA (US)

(*) Notice: Subject to any disclaimer, the term of this patent is extended or adjusted under 35 U.S.C. 154(b) by 0 days.

(21) Appl. No.: 17/022,549

(22) Filed: Sep. 16, 2020

(51) Int. Cl.
*H03M 13/11* (2006.01)

(52) U.S. Cl.
CPC ...... *H03M 13/116* (2013.01); *H03M 13/1111* (2013.01); *H03M 13/1137* (2013.01)

(58) Field of Classification Search
CPC .................................................. H03M 13/116
USPC ......................... 714/780, 776, 778, 781, 783
See application file for complete search history.

(56) References Cited

U.S. PATENT DOCUMENTS

| | | | |
|---|---|---|---|
| 9,391,643 B2 * | 7/2016 | Vojcic | H03M 13/6552 |
| 9,444,493 B2 | 9/2016 | Zhang et al. | |
| 10,263,640 B2 | 4/2019 | Djurdjevic et al. | |
| 10,340,951 B2 | 7/2019 | Symons et al. | |
| 11,128,321 B2 * | 9/2021 | Shin | H03M 13/3927 |
| 2013/0254628 A1 * | 9/2013 | Kim | H03M 13/1174 |
| | | | 714/773 |
| 2017/0359090 A1 * | 12/2017 | Shin | H03M 13/3927 |
| 2018/0109269 A1 * | 4/2018 | Richardson | H03M 13/3911 |
| 2020/0212934 A1 | 7/2020 | Sridhara et al. | |
| 2020/0212939 A1 | 7/2020 | Sridhara et al. | |

* cited by examiner

*Primary Examiner* — Fritz Alphonse
(74) *Attorney, Agent, or Firm* — Mueting Raasch Group

(57) ABSTRACT

A low-density parity check (LDPC) decoder includes a variable node unit (VNU) comprising a plurality of variable nodes configured to perform sums. A first message mapper of the LDPC decoder receives first n1-bit indices from likelihood ratio (LLR) input and maps the first n1-bit indices to first numerical values that are input to the variable nodes of the VNU. A second message mapper of the LDPC decoder receives second n2-bit indices from a check node unit (CNU) and maps the second n2-bit indices to second numerical values that are input to the variable nodes of the VNU. The CNU includes a plurality of check nodes that perform parity check operations. The first and second numerical values having ranges that are larger than what can be represented in n1-bit and n2-bit binary, respectively.

20 Claims, 7 Drawing Sheets

| VNU Scaling Input | VNU Scaling Output | | | |
|---|---|---|---|---|
| | $n=4$, no message indexing | $n=3$, no message indexing | $n=4$, with message indexing | $n=2$, with message indexing |
| ≥13 | 7 | 3 | 10 | B |
| 12 | 6 | 3 | 8 | B |
| 11 | 6 | 3 | 8 | B |
| 10 | 5 | 3 | 8 | B |
| 9 | 5 | 3 | 6 | B |
| 8 | 4 | 3 | 6 | B |
| 7 | 4 | 3 | 4 | B |
| 6 | 3 | 3 | 4 | B |
| 5 | 3 | 3 | 3 | B |
| 4 | 2 | 3 | 3 | A |
| 3 | 2 | 2 | 2 | A |
| 2 | 1 | 1 | 1 | A |
| 1 | 1 | 1 | 1 | A |
| 0 | 0 | 0 | 0 | A/-A |

| Message mapper input ($n=2$): message index | Message mapper output ($n=2$): message value |
|---|---|
| 00 | A |
| 01 | B |
| 10 | -A |
| 11 | -B |

*FIG. 6*

METHOD AND APPARATUS FOR LDPC DECODING USING INDEXED MESSAGES

SUMMARY

The present disclosure is directed to a method and apparatus for low-density parity check decoding using indexed messages. In one embodiment, a low-density parity check (LDPC) decoder includes a variable node unit (VNU) comprising a plurality of variable nodes configured to perform sums. A first message mapper of the LDPC decoder receives first n1-bit indices from likelihood ratio (LLR) input and maps the first n1-bit indices to first numerical values that are input to the variable nodes of the VNU. A second message mapper of the LDPC decoder receives second n2-bit indices from a check node unit (CNU) and maps the second n2-bit indices to second numerical values that are input to the variable nodes of the VNU. The CNU includes a plurality of check nodes that perform parity check operations. The first and second numerical values have ranges that are larger than what can be represented in n1-bit and m2-bit binary, respectively.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

FIGS. 5 and 6 are tables of decoder message maps according to example embodiments;

DETAILED DESCRIPTION

The present disclosure is generally related to encoding and decoding of data to and from a channel. For example, data that is stored on a persistent data storage device such as a hard disk drive (HDD) and solid state drive (SSD), a storage channel facilitates storing and retrieving data to and from a recording medium. For an HDD the recording medium is a magnetic disk and for an SSD the recording medium is a solid state memory cell. While the composition and operation of these types of media may be substantially different, they share characteristics common to many types of communications channels such as noise and loss. Note that while the embodiment below are described as data channels in data storage devices, the concepts may be applicable to other data channels, such as wired and wireless communications.

Low-density parity check (LDPC) codes are often used in today's storage and communication systems. An LDPC decoder decodes received noisy codeword by iteratively passing messages between columns and rows of the code's parity check matrix. The columns represent code bits and are also called variable nodes and rows represent parity check constraints and are also called check nodes. An LDPC decoder may implement min-sum decoding algorithm and include a number of variable node units (VNUs) and check node units (CNUs). The VNUs use received bit information, e.g., input log likelihood ratios (LLRs), and soft information generated in CNUs in previous iterations to form new messages to be passed to CNUs. The CNUs use messages from VNUs to form new messages to be passed to VNUs in the next decoding iteration. The messages generated in VNUs are also used together with input LLRs to form hard decisions. A reduction of the number of bits for the representation of input LLRs and messages passed between CNUs and VNUs can reduce the power/energy consumed by the decoder.

Figure 1:
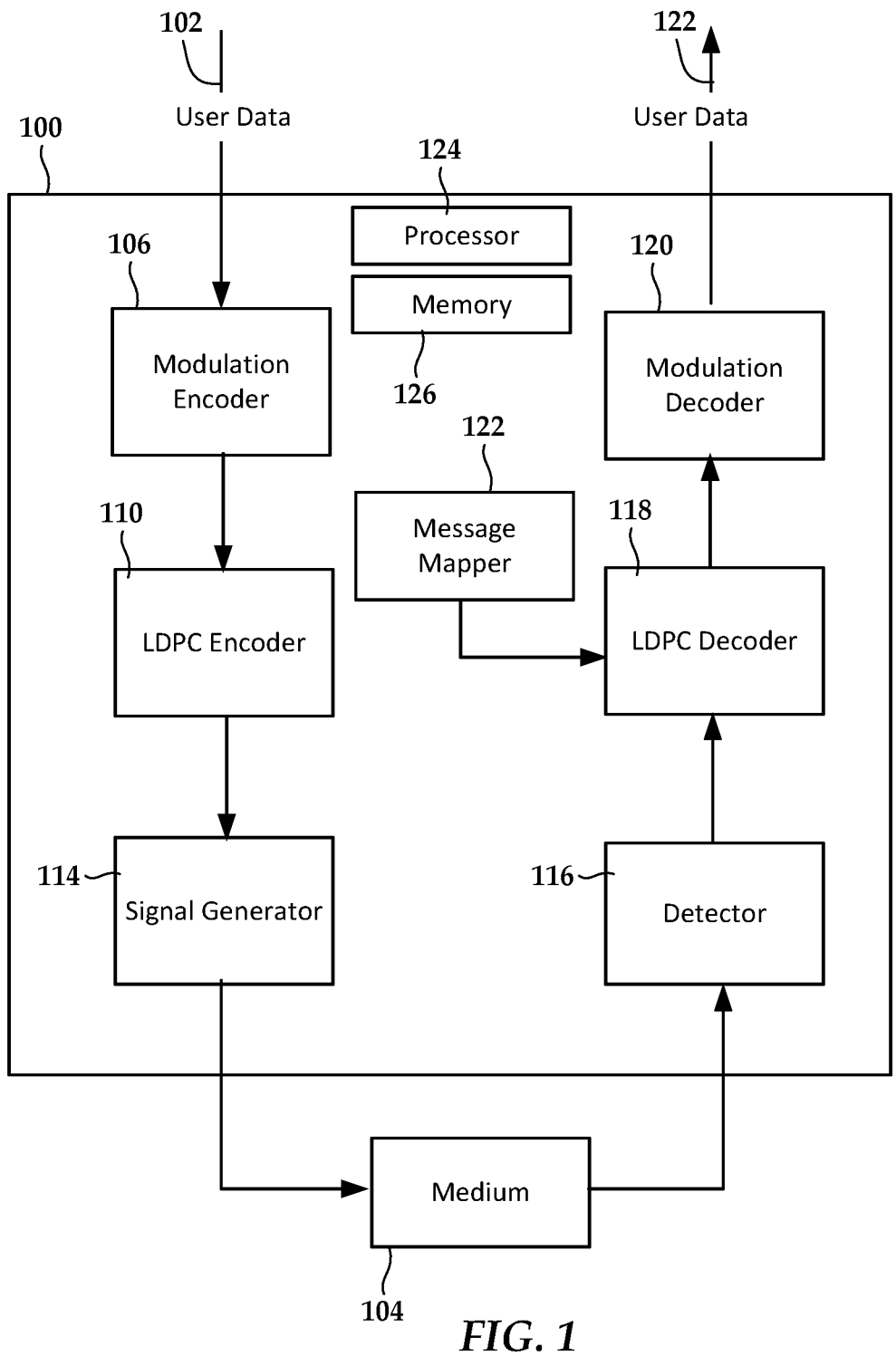
FIG. 1 is a block diagram of an encoding and decoding system and apparatus according to an example embodiment.

An encoder/decoder system is shown in the block diagram of FIG. 1. Generally, a processing circuit 100 receives a user data sequence 102 that is received, e.g., from a host computer, and is to be stored on a recording media 104, e.g., a magnetic disk, solid-state memory. The user data sequence may include a sequence of ones and zeros of any size. A modulation coder 106 converts the user data 102 to codewords for writing to disk. Generally, the modulation coder 106 removes sequences from the codewords (e.g., n-sequential ones or zeros) that are known to cause channel errors. The codewords 108 may be of a fixed length, where they can be processed by an error detection encoder 110, e.g. an LDPC encoder. The LDPC encoded data 112 is input to a signal generator 114 where it is converted to a signal appropriate to a medium 104, such as a data storage medium (e.g., magnetic disk, flash memory). In a communications system, the media 104 may be a transmission media such as wires or radio signals.

Also seen in FIG. 1 is a corresponding read path that includes a detector 226 that detects states of the medium 104 (e.g., signal values) and converts the states to a signal that is input to an LDPC decoder 118. The LDPC encoder 118 uses decoding that is compatible with the LDPC encoding performed by the encoder 110 and outputs codewords 119 that are input to a modulation decoder 120. The modulation decoder 120 uses a decoding scheme that is compatible with the encoding of the modulation encoder 106, and outputs recovered user data 122. The operations of the processing circuit 100 may be performed by special-purpose or general-purpose logic hardware, represented here as a processor 124 and memory 126.

In this disclosure, an implementation of the LDPC decoder 118 is described that indexes messages passed between operational components of the decoder 118. This allows using n-bits indices to represent messages that can range in value from, for example, 0 to $2^m-1$ inclusive, where m>n. Note that not every value between 0 to $2^m-1$, can be represented, at most $2^n$ of them, thus there may be gaps in the range of values represented by the messages. When the messages are used inside VNUs, these indices to will map to values that would normally require more than n bits in a binary representation. With this approach the performance of reduced bit width decoders can be improved. A decoder with indexing and smaller bit widths can be used to get closer to the performance of more complex larger bit width decoder with less power/energy consumption.

Figures 2A, 2B:
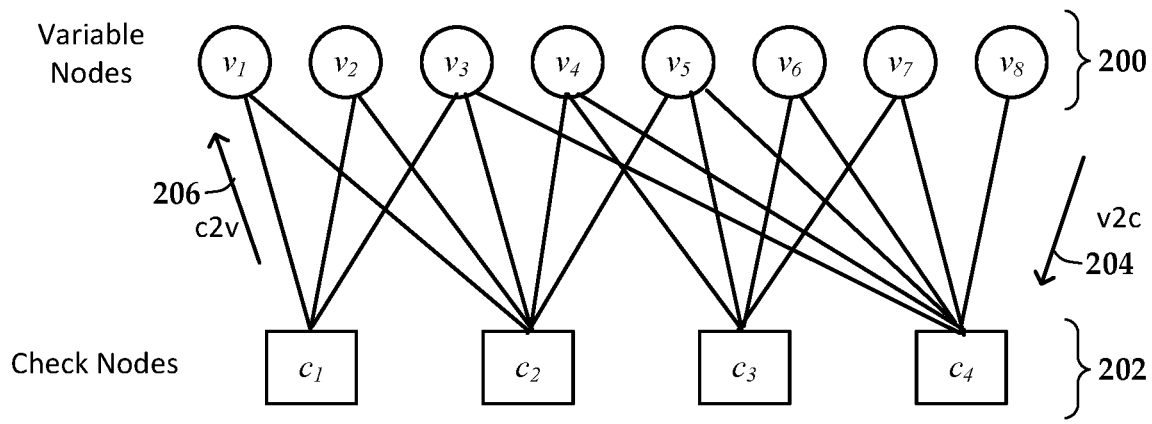
FIGS. 2A and B are a diagrams of a low-density parity check decoder nodes and H-matrix according to an example embodiment.

In FIG. 2A, a diagram shown aspects of an LDPC decoder 118 according to an example embodiment. The decoder includes a number of variable nodes 200, which are part of the VNU described above. A total of eight variable nodes 200 are shown in FIG. 2A, labeled as $v_1$-$v_8$. The variable nodes 200 communicate with a series of check nodes 202 that are part of the CNU described above. A total of four check nodes are shown in FIG. 2A, labeled as $c_1$-$c_4$. Other respective numbers and arrangements of the respective nodes 200, 202 can be provided as desired. The lines connecting the variable nodes 200 to the check nodes represent two-way communications paths for transmitting messages therebetween. These messages may go from variable to check node as indicated by v2c direction 204 or from check to variable node, as indicated by c2v direction 206. In FIG. 2B, a parity check matrix H is shown that represents the interconnections between variable and check nodes in the graph of FIG. 2A.

Input code bit reliabilities are initially loaded to the variable nodes 200, with a single bit LLR supplied in each variable node. The bit LLR values in the variable nodes are selectively combined to form v2c messages that are transferred to the corresponding check nodes 202. For example, check node $c_1$ receives bits from variable nodes $v_1$, $v_2$ and $v_1$. Once received, the v2c messages are evaluated by the check nodes 202 using certain parity constraints to resolve the code word. In one example, the check nodes 202 may implement an even parity constraint so that all of the bits in a given v2c message should sum up to a zero (even) value. Other parity constraints can be used.

Messages with these parity computational results are returned in the form of c2v messages. Generally, each iteration of the LDPC algorithm involves the generation and transfer of one set of v2c messages to the check nodes, followed by the return of one set of c2v messages to the variable nodes. If no errors are present, the resulting code word is resolved and the data are output. If at least one error is present, the values of the variable nodes 200 are updated using the c2v messages and, in some cases, other information. Subsequent iterations may be applied in an effort to resolve the code word.

The computation of the v2c messages from the i-th variable node to the j-th variable check node in FIG. 2A can be expressed as in Equation (1) below, where $LLR_i$ is the channel log-likelihood ratio corresponding to the i-th variable node, and $r_{j \to i}$ represents the c2v message from the j-th check node to the i-th variable node.

$$q_{i \to j} = LLR_i + \Sigma_{j' \in N(j) \setminus i} r_{j' \to i} \quad (1)$$

The LLR values are multi-bit estimates of probability of a two state null-hypothesis regarding the existing state of the associated variable nodes. The higher the magnitude of the $LLR_i$ value, the more likely it is that the existing bit state (0 or 1) of the i-th variable node is the correct value. The lower the magnitude of the $LLR_1$ value, the more likely it is that the alternate bit value (1 or 0) is the correct state.

Equation (1) shows that each v2c message includes an informational content of previous messages, as well as soft information that can provide further clues to aid in the decoding of the code word. In some cases, the check nodes can use the information provided by the overall magnitude of the v2c message to make adjustments to the contents in the variable nodes. The corresponding c2v messages from the j-th check node to the i-th variable node can be expressed as shown below in Equation (2).

$$r_{j \to i} = \Pi_{i' \in N(j) \setminus i} \, \text{sign}(q_{i' \to j}) \cdot \min_{i' \in N(j) \setminus i} |q_{i' \to j}| \quad (2)$$

The LDPC decoder 118 may implement a min-sum algorithm which approximates the more computationally complex belief propagation algorithm while using simplified hardware/software. One issue with a min-sum algorithm is degraded waterfall performance as compared to that available using a pure belief propagation approach, so that the min-sum algorithm provides worse code word failure rates at the same raw bit error rate (RBER).

Another issue with a min-sum algorithm is the finite precision available in the respective v2c and c2v messages. As noted above, a practical result of this finite precision is that there is a maximum magnitude that can be achieved in the size of the v2c messages. Whether implemented in software or hardware, there will generally be a maximum total of n bits available to describe the respective v2c and c2v messages. Values such as n=4 bits, n=8 bits, etc., may be more suitable for hardware decoder based implementations. Higher values, such as n=32, n=64, etc., may be more suitable for software based implementations. As will be appreciated, the various embodiments disclosed herein are suitable for both types of implementations.

The $q_{ij}$ values can grow very large, causing the v2c messages to achieve saturation, which as described above is a situation where the maximum available value has been reached (e.g., a v2c message of n-bits in length where each n bit value is a logical 1). From equations (1) and (2), it can be seen that, in some cases, saturation may be achieved in just a few iterations of the LDPC decoder.

Therefore, embodiments described below include features that can reduce the size of data transferred between variable and check nodes while still allowing reasonable performance of the LDPC decoder. Generally, and indexing scheme is used that allows an n-bit message to include a number whose maximum value can range, for example, from 0 to $2^{m-1}-1$, where m is greater than n. There is some loss of resolution through the range, e.g., only $2^n$ distinct values can be represented within this range, such that some values within the range are not representable. This indexing scheme can be used to features that reduce the effects of saturation in the LDPC decoder.

Figure 3:
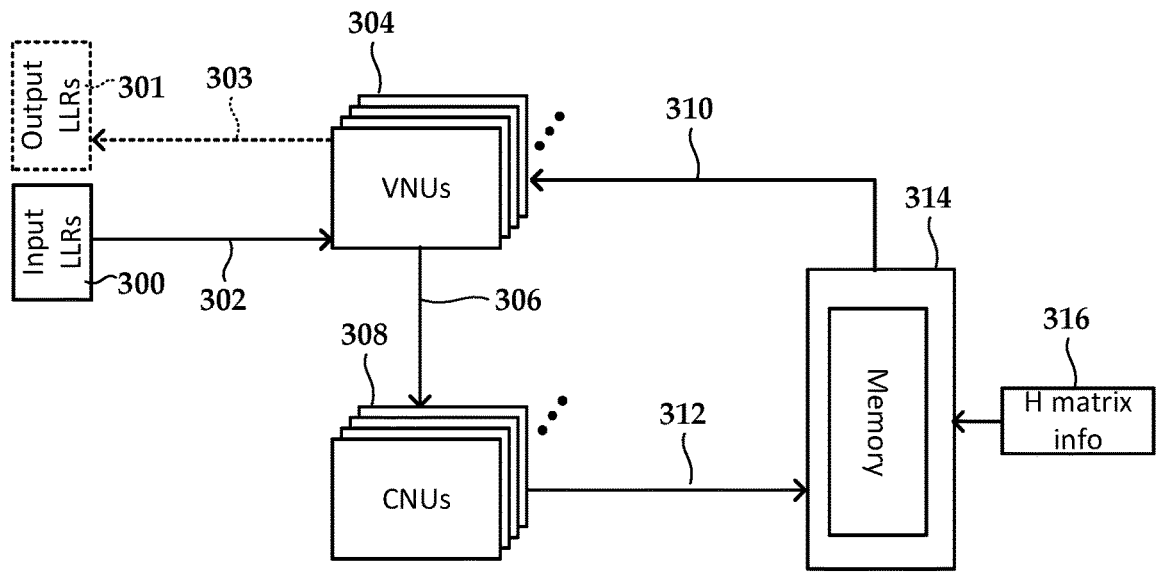
FIGS. 3 and 4 are diagrams of a low-density parity check decoder according to an example embodiment.

In FIG. 3, a block diagram shows message transfer paths in an LDPC decoder according to an example embodiment. Path 302 is from input LLRs 300 to the VNUs 304. Generally, the input LLRs 300 are data that are read from a storage or communications channel. The input LLRs 300 may in some embodiments include soft data from a soft-output Viterbi algorithm (SOVA) decoder from a hard disk read channel, estimated soft values from multiple reads a flash memory controller, a communication media soft decoder, etc. In some of these embodiments, the detecting and decoding may be done jointly, which involve passing output messages from the VNUs 304 to output LLRs 301 via message path 303. The VNUs 304 pass v2c messages to CNUs 308 via path 306. The CNUs pass messages to memory 314 via path 312 some or all of these messages being passed as c2v messages to VNUs 304 via path 310. The memory 314 also receives/stores the H matrix information 316, e.g., as shown in FIG. 2B.

Figure 4:
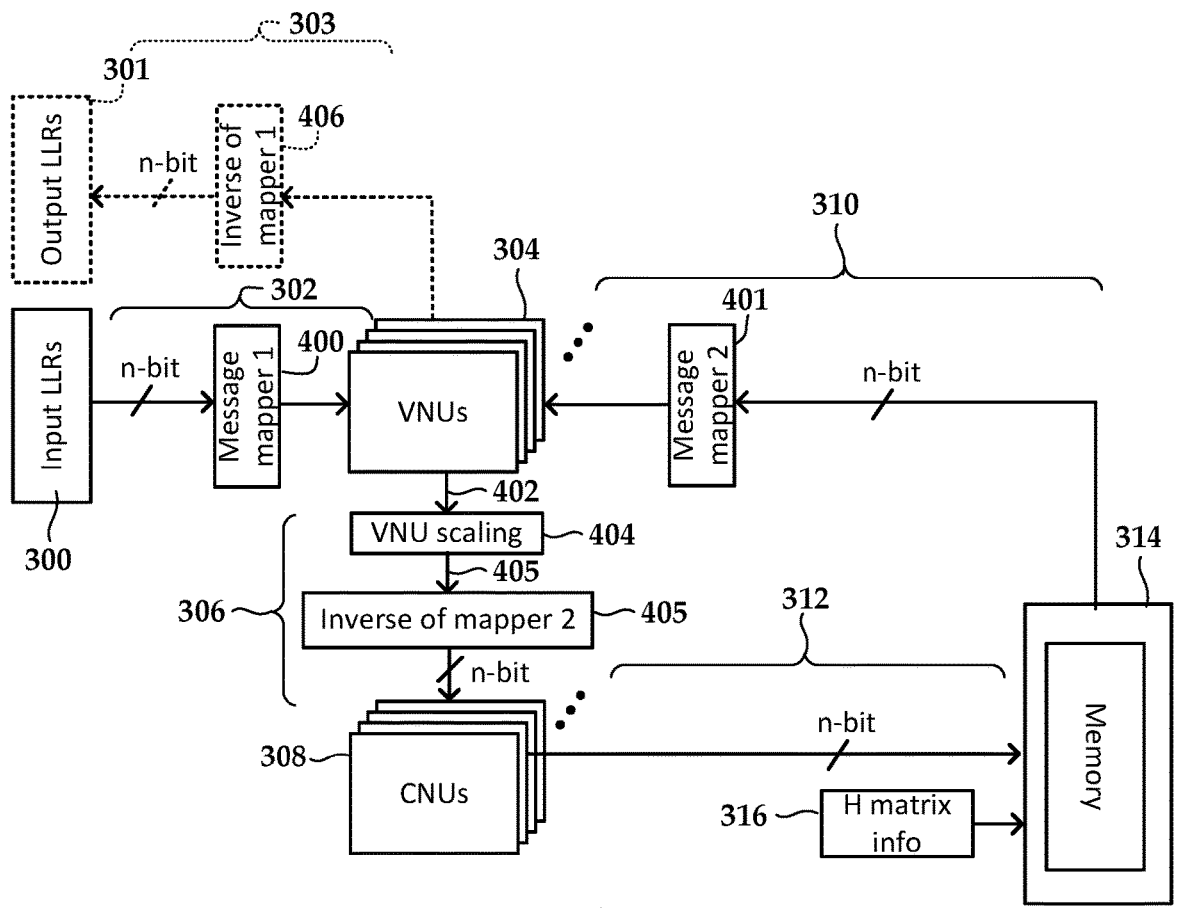

The bit widths of input LLRs 300 and messages going to and from VNUs 304 and CNUs 308 largely determine the power/energy consumption of a decoder. Increasing the number of bits used for binary representation of these messages improves the error rate but also increases the hardware complexity and power/energy consumption. Input LLRs 300 can come directly from the channel or as the output of a detector. The LDPC decoder can also generate output soft messages to be iteratively exchanged with a detector. In conventional decoders, message paths 302, 306, 310, 312 may use a common representation, e.g., an n-bit binary message that represents $2^n$ values, e.g., 0 to $2^n-1$ if unsigned integers are used or $-2^{n-1}$ to $2^{n-1}-1$ if two's complement signed integers are used. In embodiments described herein, the message paths 302, 306, 310, 312 utilize message mappers that can be used to increase the size of numbers that can be represented in the decoder without increasing the number of bits. Thus, in the above example of unsigned integers, the range of values of the n-bit messages can be from 0 to $i_{max}$, where $i_{max} > 2^n - 1$ In FIG. 4, a diagram shows how message mappers can be implemented in the LDPC decoder shown in FIG. 3. Message mappers 400, 401 are added to each VNU unit input. The message mappers 400, 401 map a binary representation of a message, e.g., message index, to a calculation value that would require a larger number of bits for binary representation in a conventional representation. Since CNU unit commonly determines first and second minimum for a particular check node, it will retain the same set of values for the messages at its output (path 312) as at its input and does not require a mapper. The message mappers 400, 401 may use different mapping between message indices and output values to account for differences between the messages sent by the input LLRs 300 and CNUs 308. Also note that message paths 302, 303, 306, 310, and 312 are all shown using n-bit indexed messages. In some embodiments, however, some path may use different bit widths. For example, paths 302, 303 between input/output LLRs 300, 301 may use n1-bit indexed messages, and paths 306, 310, and 312 between VNUs 304 and CNUs 308 may use n2-bit indexed messages, where n1≠n2 in some embodiments.

The VNU units 304 that implement a min-sum algorithm are performing addition of messages. Hence, there may be a set of values that is larger and different at the VNU output 402 than the set of values at its input. For this reason, at VNU output there is a mapper referred to as a VNU scaling 404 unit that maps all possible VNU output values to the set of allowed message values that can be represented by a n-bit numbers. The reason this mapper 404 is called a scaling unit is because this unit 404 performs scaling (and desaturation) to optimize the decoder's error rate, error floor and average iteration count. The allowed message values at VNU scaling output 405 are mapped back to their indices in via an inverse message mapper 405.

As noted above, the input LLRs 300 may be provided from a flash memory channel (e.g., in an SSD) or a SOVA detector (e.g., in a hard disk drive). In either case, the channel or detector may work with data in a native format (e.g., m-bit binary), which is then translated to the n-bit indices. The input LLRs 300 may output LLR indices (e.g., in an SSD implementation) or distorted LLRs generated by a SOVA detector (e.g., in a hard disk implementation). Where a SOVA detector or the like is used, the detector and VNU's 304 may iteratively exchange data as part of a joint detecting and decoding process. In such an embodiment, an inverse mapper 406 may be used that provides a mapping that is inverse of the first mapper 400. This provides an n-bit index that is sent to output LLRs 301, which may also transform data from the indexed format to a native format. Note that these components 406, 301 may not be used in all embodiments, e.g., SSD drives.

A few specific examples of VNU scaling and message mapping according to example embodiments are shown the tables of FIGS. 5 and 6. In these examples for VNU scaling, a symmetric mapping around 0 is assumed. Thus, using column 500 as an example, the mapping would extend from inputs going from −1 to <−13, with the VNU outputs going from −1 to −8, respectively. Columns 500 and 501 in the table of FIG. 5 are examples of respective 4-bit and 3-bit values that are scaled without indexing. Note that the scaling tends to deemphasize distinctions between higher-valued numbers, particularly in column 501 where all input values >3 are set to 3.

Columns 502 and 503 are examples of respective 4-bit and 2-bit values that are scaled with indexing. In column 502, a maximum value of 10 is shown, which would require 5-bits to represent as a signed integer. In column 503, arbitrary values of A and B are used as outputs. Note that the zero input in column 503 can be either +A or −A. The reason for this is shown in FIG. 6, where there is no zero in the mapped output, thus allowing the range from −B to +B to be represented, instead of −B to A, which would be the result of unmapped, two's complement representation.

Figure 7:
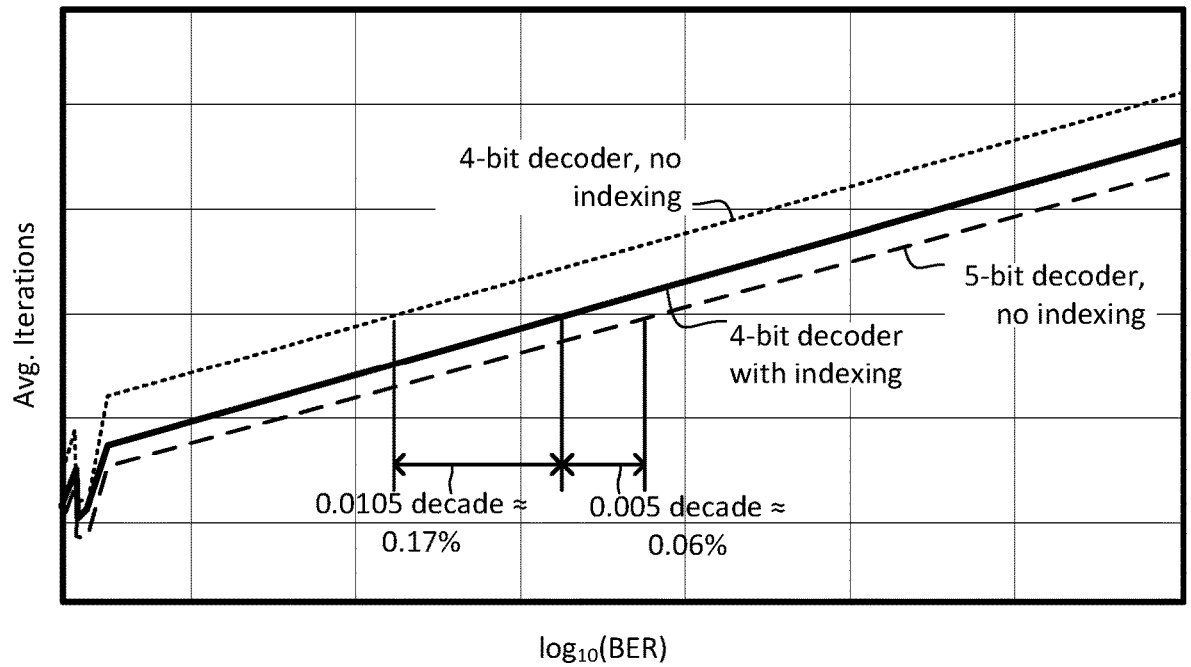
FIG. 7-9 are graphs showing performance of a decoder according to an example embodiment.
Figure 8:
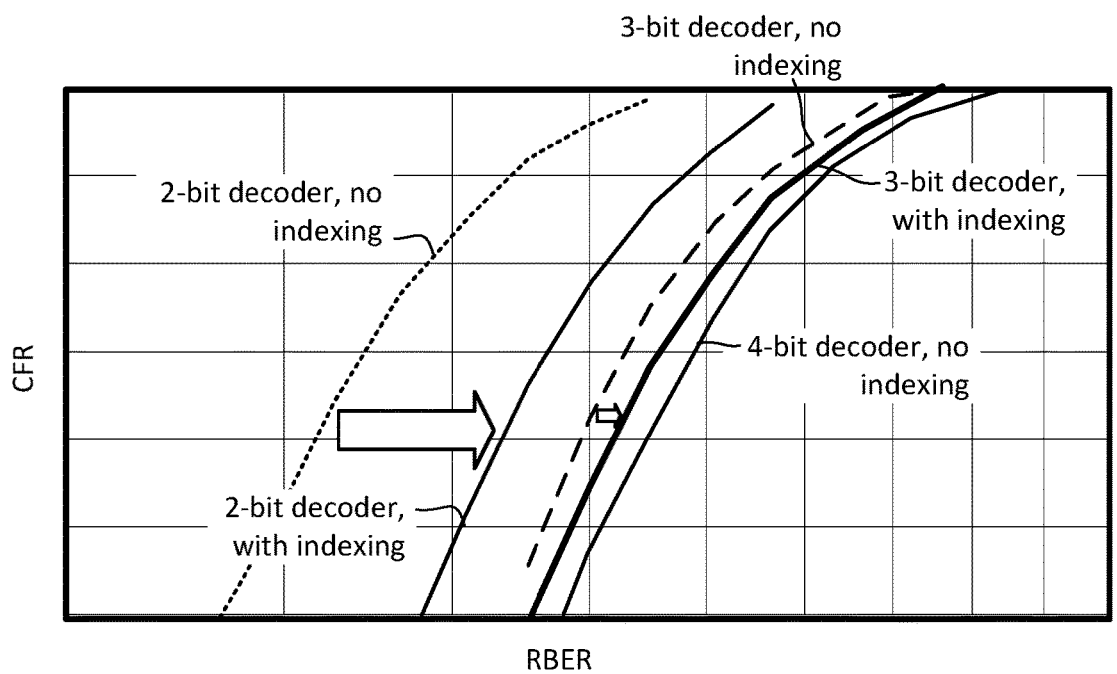
Figure 9:
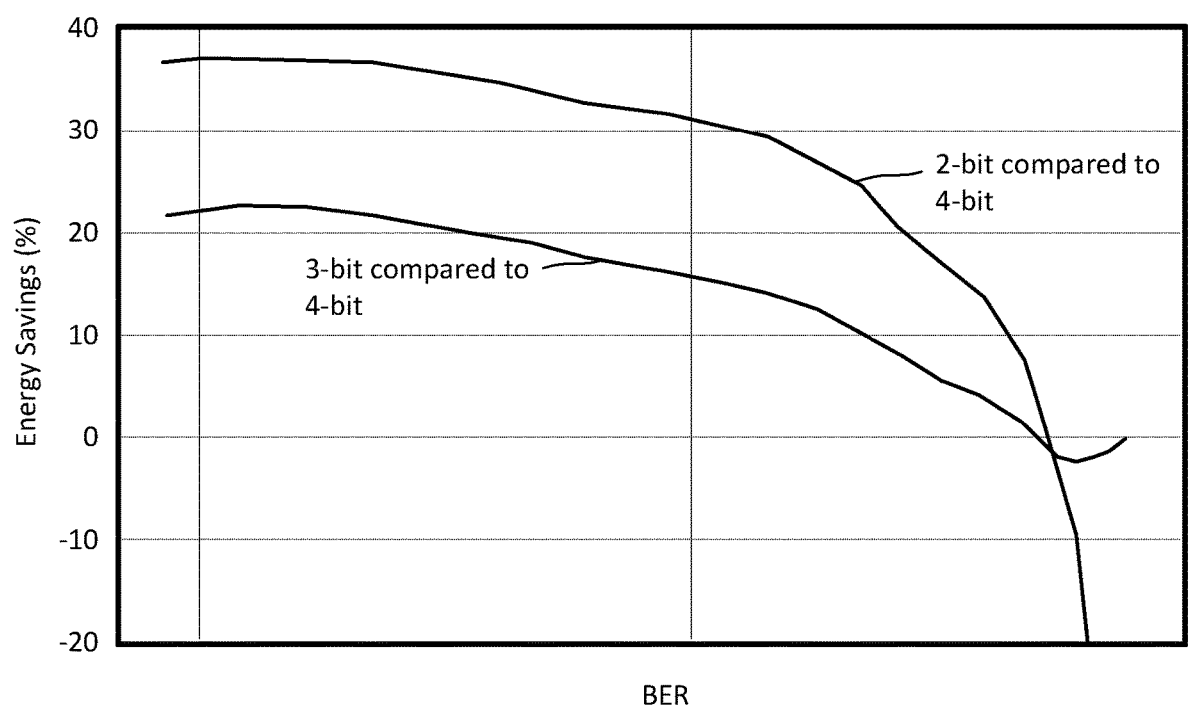

In FIGS. 7-9, graphs show measurements of an LDPC decoder using mapped messages according to an example embodiment. The graph in FIG. 7 shows that a 4-bit decoder can approach the performance of a 5-bit decoder using indexing in a hard disk drive (HDD) read channel. It is notable that this performance improvement is achieved with minimal hardware complexity increase and no power/energy increase compared to the 4-bit non-indexed decoder. The results are obtained on real data from a hard disk drive. In this case, the decoder obtains soft information from a soft input soft output (SISO) detector. A SISO detector and decoder iteratively exchange soft information during decoding. In addition to this, proposed message indexing in an iterative system including a detector and a decoder can be extended beyond the decoder, e.g., message mapping can be used at the detector input and output or in some other blocks of the iterative loop.

The graph in FIG. 8 shows codeword failure rate (CFR) performance improvement of a 2-bit and a 3-bit decoder using message indexing. In this example, lower complexity decoders show improved error rates, getting them closer to the 4-bit decoder performance. In addition to using message indexing, to achieve improvements in this example, iteration dependent indexing of input LLRs is also used, starting with large input LLRs and decreasing their magnitude as decoding proceeds.

In some embodiments, the same hardware implementation can support both low and high bit widths for decoder messages. This decoder implementation would be able to run in multiple modes, and in each mode different number of bits in a binary representation would be active and different message mapping could be used. This may be useful, for example, in SSDs.

The power/energy savings of 2-bit and 3-bit decoders compared to 4 bit decoder is shown in the graph of FIG. 9 and can be significant (up to 25 or 35%) especially in the low raw bit error rate (RBER) region. This is useful in SSD applications, where decoding can start with a low energy decoder in a 2-bit mode, for example, and that would be sufficient for most of the codewords in the beginning of life or middle of life of the flash. Only pages with more (e.g., unrecoverable) errors would require decoding with a slightly higher energy 3-bit or even a 4-bit decoder modes, but majority of the pages would be successfully decoded most of the time with a low energy 2 or 3-bit decoder. The successive decoding attempts are accomplished with the same hardware and also with no additional reads, so no significant hardware changes or significant additional decoding delays are required to obtain this energy/power saving.

Note that where different bit-width indexed messages (e.g., n1-bit and n2-bit) are used in different paths, the change in bit width mode can affect both paths. For example, one mode may use n1-bit indexed messages between the VNUs and input/output LLRs and n2-bit indexed messages between the VNUs and CNUs. In a different mode, m1-bit indexed messages are used between the VNUs and input/output LLRs and m2-bit indexed messages between the VNUs and CNUs, where m1>n1 and m2>n2.

Figure 10:
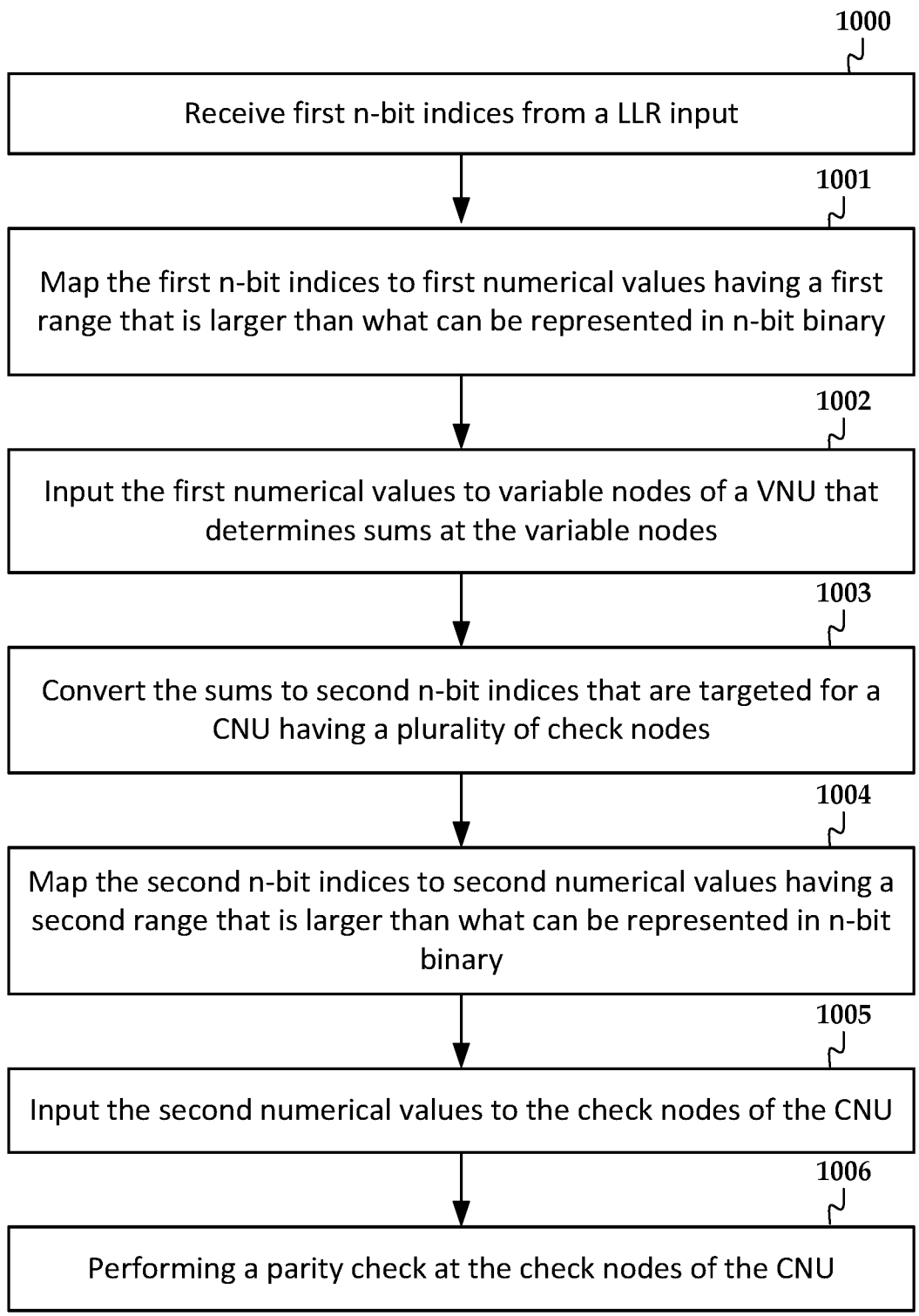
FIG. 10 is a flowchart of a method according to an example embodiment.

In FIG. 10, a flowchart shows a method according to an example embodiment. The method involves receiving 1000, at an LDPC decoder, first n-bit indices from an LLR input. The first n-bit indices are mapped 1001 to first numerical values having a first range that is larger than what can be represented in n-bit binary. The first numerical values are input 1002 to variable nodes of a VNU of the LDPC decoder, the VNU determining sums at the variable nodes. The sums are converted 1003 to second n-bit indices that are targeted for a check node unit (CNU) having a plurality of check nodes. The second n-bit indices are mapped 1004 to second numerical values having a second range that is larger than what can be represented in n-bit binary. The second numerical values are input 1005 to the check nodes of the CNU, and a parity check is performed 1006 at the check nodes of the CNU. The parity check at the CNU 1006 and the determining 1002 of the sums at the VNU are performed iteratively until the decoder converges on a solution (or fails to converge) and an output value is determined.

In summary, an LDPC decoder is described that includes a VNU scaling unit, message indexing of messages from CNUs to VNUs and also message indexing of input LLRs. The LDPC decoder may use different message indexing for the messages from CNUs to VNUs than that for the input LLRs to the VNUs. In some embodiments, the message indexing (of CNUs to VNUs messages and of input LLRs) can be iteration dependent. The LDPC decoder may be configured to support multiple bit widths of messages with the same hardware. An iterative decoding system may include a soft input soft output (SISO) detector and a decoder that iteratively exchange soft messages where message indexing is used at the decoder and/or detector. All of the above embodiments may be used in HDD, SSD and/or communication system. In an SSD system, the LDPC decoder may be used over multiple times with different message binary representation and different message indexing but no additional reads.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A low-density parity check (LDPC) decoder, comprising:
    a variable node unit (VNU) comprising a plurality of variable nodes configured to perform sums;
    a first message mapper that receives first n1-bit indices from a likelihood ratio (LLR) input and maps the first n1-bit indices to first numerical values that are input to the variable nodes of the VNU, the first numerical values having a first range that is larger than what can be represented in n1-bit binary; and
    a second message mapper that receives second n-bit indices from a check node unit (CNU) and maps the second n2-bit indices to second numerical values that are input to the variable nodes of the VNU, the CNU comprising a plurality of check nodes that perform parity check operations, the second numerical values having a second range that is larger than what can be represented in n2-bit binary.

2. The LDPC decoder of claim 1, further comprising;
    a scaling unit that scales sums that are output from the VNU to a set of allowed message values of the CNU; and
    a reverse mapper that maps the allowed message values to n-bit indices that are sent to the CNU to perform the parity check operations.

3. The LDPC decoder of claim 2, wherein the scaling unit performs desaturation of the sums.

4. The LDPC decoder of claim 1, wherein n1 equals n2, and wherein a first mapping between the first n1-bit indices and the first numerical values is different than a second mapping between the second n2-bit indices and the second numerical values.

5. The LDPC decoder of claim 1, wherein a mapping between the first n1-bit indices and the first numerical values changes for different iterations of the LDPC decoder.

6. The LDPC decoder of claim 1, wherein the LLR input is received from a soft output detector, wherein the first message mapper and an inverse of the first message mapper are used to iteratively exchange message indices between the soft output detector and the VNU.

7. The LDPC decoder of claim 1, wherein the LDPC decoder is configured to operate a first mode using the n1-bit and n2-bit indices and in a second mode with respective m1-bit and m2-bit indices, wherein m1>n1 and m2>n2, the first and second mappers using different mappings in the first and second modes.

8. The LDPC decoder of claim 7, wherein LLR input is from flash memory, and wherein the decoding initially starts in the first mode, and switches to the second mode in response to unrecoverable errors.

9. The LDPC decoder of claim 8, wherein the switching from the first mode to the second mode does not involve additional reads of the flash memory.

10. A method comprising:
    receiving, at a low-density parity check (LDPC) decoder, first n1-bit indices from a log-likelihood ratio (LLR) input;
    mapping the first n-bit indices to first numerical values having a first range that is larger than what can be represented in n1-bit binary;
    inputting the first numerical values to variable nodes of a variable node unit (VNU) of the LDPC decoder that determines sums at the variable nodes;
    converting the sums to second n2-bit indices that are targeted for a check node unit (CNU) comprising a plurality of check nodes;

mapping the second n2-bit indices to second numerical values having a second range that is larger than what can be represented in n2-bit binary;

inputting the second numerical values to the check nodes of the CNU; and performing a parity check at the check nodes of the CNU, wherein the parity check at the CNU and the determining of the sums at the VNU are performed iteratively until an output value is determined.

11. The method of claim 10, further comprising;

scaling sums that are output from the VNU to a set of allowed message values of the CNU; and reverse mapping the allowed message values to n-bit indices that are sent to the CNU to perform the parity check operations.

12. The method of claim 11, wherein scaling the sums comprising desaturation of the sums.

13. The method of claim 10, wherein n1 equals n2, and wherein a first mapping between the first n1-bit indices and the first numerical values is different than a second mapping between the second n2-bit indices and the second numerical values.

14. The method of claim 10, wherein a mapping between the first n1-bit indices and the first numerical values changes for different iterations of the LDPC decoder.

15. The method of claim 10, wherein the LLR input is received from a soft output detector, the method further comprising iteratively exchanging message indices between the soft output detector and the VNU.

16. A system comprising:

a data interface configured to receive data from a storage medium; and an LDPC decoder coupled to the data interface and comprising:

a first message mapper that receives first n1-bit indices from the data interface and maps the first n1-bit indices to first numerical values;

a variable node unit (VNU) comprising a plurality of variable nodes configured to receive and perform sums on the first numerical values; and a second message mapper that receives second n2-bit indices from a check node unit (CNU) and maps the second n2-bit indices to second numerical values that are input to the variable nodes of the VNU, the CNU comprising a plurality of check nodes that perform parity check operations, the first and second numerical values having respective first and second ranges that are larger than what can be represented in respective n1-bit and n2-bit binary.

17. The system of claim 16, wherein the data interface comprises a soft output detector, wherein the first message mapper and an inverse of the first message mapper are used to iteratively exchange message indices between the soft output detector and the VNU.

18. The system of claim 16, wherein the LDPC decoder is configured to operate a first mode using the n1-bit and n2-bit indices and in a second mode with respective m1-bit and m2-bit indices, wherein m1>n1 and m2>n2, the first and second mappers using different mappings in the first and second modes.

19. The system of claim 18, wherein storage medium comprises flash memory, and wherein the decoding initially starts in the first mode, and switches to the second mode in response to unrecoverable errors.

20. The system of claim 19, wherein the switching from the first mode to the second mode does not involve additional reads of the flash memory.

* * * * *